United States Patent
Liang et al.

(10) Patent No.: US 10,529,603 B2
(45) Date of Patent: Jan. 7, 2020

(54) HIGH PRESSURE WAFER PROCESSING SYSTEMS AND RELATED METHODS

(71) Applicant: Micromaterials, LLC, Wilmington, DE (US)

(72) Inventors: Qiwei Liang, Fremont, CA (US); Srinivas D. Nemani, Sunnyvale, CA (US); Adib M. Khan, Santa Clara, CA (US); Venkata Ravishankar Kasibhotla, Bangalore (IN); Sultan Malik, Sacramento, CA (US); Sean Kang, San Ramon, CA (US); Keith Tatseun Wong, Los Gatos, CA (US)

(73) Assignee: Micromaterials, LLC, Wilmington, DE (US)

(*) Notice: Subject to any disclaimer, the term of this patent is extended or adjusted under 35 U.S.C. 154(b) by 0 days.

(21) Appl. No.: 16/292,289

(22) Filed: Mar. 4, 2019

(65) Prior Publication Data
US 2019/0198367 A1  Jun. 27, 2019

Related U.S. Application Data

(63) Continuation of application No. 15/835,356, filed on Dec. 7, 2017, now Pat. No. 10,224,224.
(Continued)

(51) Int. Cl.
*H01L 21/67* (2006.01)
*C23C 16/52* (2006.01)
(Continued)

(52) U.S. Cl.
CPC ........ *H01L 21/67196* (2013.01); *C23C 16/52* (2013.01); *H01L 21/324* (2013.01);
(Continued)

(58) Field of Classification Search
CPC ............. H01L 21/324; H01L 21/76841; H01L 21/68742; H01L 21/67196; H01L 21/67167; C23C 16/52
See application file for complete search history.

(56) References Cited

U.S. PATENT DOCUMENTS

| | | | |
|---|---|---|---|
| 4,524,587 A | 6/1985 | Kantor | |
| 5,050,540 A | 9/1991 | Lindberg | |
| (Continued) | | | |

FOREIGN PATENT DOCUMENTS

| | | | |
|---|---|---|---|
| CN | 101871043 A | 10/2010 | |
| CN | 104047676 A | 9/2014 | |
| (Continued) | | | |

OTHER PUBLICATIONS

International Search Report and Written Opinion for PCT/US2019/014759 (APPM/44014994PC) dated May 14, 2019.
(Continued)

*Primary Examiner* — William Coleman
(74) *Attorney, Agent, or Firm* — Patterson + Sheridan, LLP

(57) ABSTRACT

A high-pressure processing system for processing a substrate includes a first chamber, a pedestal positioned within the first chamber to support the substrate, a second chamber adjacent the first chamber, a vacuum processing system configured to lower a pressure within the second chamber to near vacuum, a valve assembly between the first chamber and the second chamber to isolate the pressure within the first chamber from the pressure within the second chamber, and a gas delivery system configured to introduce a processing gas into the first chamber and to increase the pressure within the first chamber to at least 10 atmospheres while the processing gas is in the first chamber and while the first chamber is isolated from the second chamber.

20 Claims, 7 Drawing Sheets

Related U.S. Application Data

(60) Provisional application No. 62/470,057, filed on Mar. 10, 2017.

(51) Int. Cl.
*H01L 21/324* (2006.01)
*H01L 21/687* (2006.01)
*H01L 21/768* (2006.01)

(52) U.S. Cl.
CPC .... *H01L 21/67017* (2013.01); *H01L 21/6719* (2013.01); *H01L 21/67098* (2013.01); *H01L 21/67126* (2013.01); *H01L 21/67167* (2013.01); *H01L 21/67201* (2013.01); *H01L 21/68742* (2013.01); *H01L 21/76841* (2013.01); *H01L 21/67103* (2013.01)

(56) References Cited

U.S. PATENT DOCUMENTS

| | | | |
|---|---|---|---|
| 5,114,513 A | 5/1992 | Hosokawa et al. |
| 5,149,378 A | 9/1992 | Ohmi et al. |
| 5,175,123 A | 12/1992 | Vasquez et al. |
| 5,319,212 A | 6/1994 | Tokoro |
| 5,590,695 A | 1/1997 | Siegele et al. |
| 5,620,524 A | 4/1997 | Fan et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Li et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 * | 10/2015 | Rajagopalan ........... H01L 21/00 |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1 | 6/2002 | Frankel et al. |
| 2002/0122885 A1 | 9/2002 | Ahn |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2013/0194350 A1 | 8/2013 | Watanabe et al. |
| 2013/0233170 A1 | 9/2013 | Spiegelman et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |

(56) References Cited

U.S. PATENT DOCUMENTS

| | | |
|---|---|---|
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0334162 A1 | 11/2016 | Kim et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0261480 A1 | 9/2018 | Liang et al. |

FOREIGN PATENT DOCUMENTS

| | | |
|---|---|---|
| CN | 104089491 A | 10/2014 |
| JP | H07048489 B2 | 5/1995 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2010-205854 A | 9/2010 |
| JP | 2012-503883 A | 2/2012 |
| JP | 2012-204656 A | 10/2012 |
| JP | 2013516788 A | 5/2013 |
| JP | 2014019912 A | 2/2014 |
| KR | 20070075383 A | 7/2007 |
| KR | 20090011463 A | 2/2009 |
| KR | 1020090040867 A | 4/2009 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2008/089178 A2 | 7/2008 |
| WO | 2011/103062 A2 | 8/2011 |
| WO | 2012/133583 A1 | 10/2012 |
| WO | 2016065219 A1 | 4/2016 |

OTHER PUBLICATIONS

International Search Report and Written Opinion for PCT/US2019/015332 (APPM/44014895PC) dated May 15, 2019.
International Search Report and Written Opinion for PCT/US2018/059676 (APPM/25833PC) dated May 23, 2019.
International Search Report and Written Opinion for PCT/US2019/023431 (APPM/44015232PC) dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136181 (APPM/025417TW01).
International Search Report and Written Opinion from PCT/US2018/034036 (APPM/25104PC) dated Aug. 24, 2018.
International Search Report, Application No. PCT/US2018/028258 (APPM/25170PC) dated Aug. 9, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688 (APPM/25059WO01).
International Search Report and Written Opinion for PCT/US2018/043160 (APPM/25068PC) dated Jan. 31, 2019.
International Search Report and Written Opinion dated Jan. 31, 2019 for Application No. PCT/US2018/042760 (APPM/25102PC).
International Search Report and Written Opinion for PCT/US2018/059643 (APPM/25301PC) dated Feb. 26, 2019.
International Search Report and Written Opinion from PCT/US2019/012161 dated Apr. 30, 2019 (APPM/25703US).
International Search Report and Written Opinion dated Nov. 30, 2018 for Application No. PCT/US2018/041688 (APPM/25059W001).
International Search Report and Written Opinion for PCT/US2018/037539 (APPM/24939PC) dated Oct. 5, 2018.
International Search Report and Written Opinion for PCT/US2018/038822 (APPM/24681PC) dated Oct. 26, 2018.
International Search Report and Written Opinion from PCT/US2018/034036 dated Aug. 24, 2018.
International Search Report and Written Opinion dated Aug. 24, 2018 for Application No. PCT/US2018/034284 (APPM/025105PC).
International Search Report, Application No. PCT/US2018/028258 dated Aug. 9, 2018.
International Search Report and Written Opinion for PCT/US2018/035210 (APPM/25236PC) dated Aug. 24, 2018.
International Search Report and Written Opinion for PCT/US2018/021715 dated Jun. 22, 2018.
Office Action for U.S. Appl. No. 15/835,356 (APPM/024892USC01) dated May 31, 2018.
International Search Report and Written Opinion for International Application No. PCT/US2019/029602 (APPM/44015258WO01) dated Aug. 14, 2019.
Taiwan Office Action dated Jun. 11, 2019 for Application No. 107138905 (APPM/25799TW).
Office Action for Japanese Application No. 2018-546484 (APPM/023712JP01) dated Oct. 8, 2019.
International Search Report and Written Opinion for International Application No. PCT/US2019/040195 (APPM/44015662WO01) dated Oct. 25, 2019.

* cited by examiner

HIGH PRESSURE WAFER PROCESSING SYSTEMS AND RELATED METHODS

CROSS-REFERENCE TO RELATED APPLICATIONS

This application is a continuation of U.S. patent application Ser. No. 15/835,356 filed Dec. 7, 2017, which claims benefit of U.S. Provisional Patent Application Ser. No. 62/470,057, filed on Mar. 10, 2017, which are each herein incorporated by reference.

TECHNICAL FIELD

This specification relates to wafer processing systems and related methods.

BACKGROUND

Micro-electronic circuits and other micro-scale devices are generally manufactured from a substrate or wafer, such as a silicon or other semiconductor material wafer. Multiple metal layers are applied onto the substrate to form micro-electronic or other micro-scale components or to provide electrical interconnects. These metal layers, e.g., copper, are plated onto the substrate, and form the components and interconnects in a sequence of photolithographic, plating, etching, polishing or other steps.

To achieve desired material properties, the substrate is typically put through an annealing process in which the substrate is quickly heated, usually to about 200-500° C. and more typically to about 300-400° C. The substrate may be held at these temperatures for a relatively short time, e.g., 60-300 seconds. The substrate is then rapidly cooled, with the entire process usually taking only a few minutes. Annealing may be used to change the material properties of the layers on the substrate. It may also be used to activate dopants, drive dopants between films on the substrate, change film-to-film or film-to-substrate interfaces, densify deposited films, or to repair damage from ion implantation.

As feature sizes for microelectronic devices and interconnects become smaller, the allowable defect rate decreases substantially. Some defects result from contaminant particles. Other defects can result from incomplete processing of certain regions of the wafer, e.g., failure to grow a film at the bottom of a trench.

Various annealing chambers have been used in the past. In single wafer processing equipment, these annealing chambers typically position the substrate between or on heating and cooling elements, to control the temperature profile of the substrate. However, achieving precise and repeatable temperature profiles, as well as an acceptable level of defects, can present engineering challenges.

SUMMARY

In one aspect, a high-pressure processing system for processing a substrate includes a first chamber, a pedestal positioned within the first chamber to support the substrate, a second chamber adjacent the first chamber, a vacuum processing system configured to lower a pressure within the second chamber to near vacuum, a valve assembly between the first chamber and the second chamber to isolate the pressure within the first chamber from the pressure within the second chamber, a gas delivery system configured to introduce a processing gas into the first chamber and to increase the pressure within the first chamber to at least 10 atmospheres while the processing gas is in the first chamber and while the first chamber is isolated from the second chamber, and a controller. The controller is configured to operate the gas delivery system to introduce the processing gas into the first chamber, and to open the valve assembly to enable the substrate to be transferred from the first chamber to the second chamber.

Implementations may include one or more of the following features.

The valve assembly may include a slit valve between the first chamber and the second chamber. The slit valve may include a slit through a wall between the first chamber and the second chamber, and an arm movable between a first position in which the arm covers the slit to form a seal between the first chamber and the second chamber and a second position in which the slit is uncovered. The substrate may be transferrable through the slit valve from the first chamber to the second chamber. The arm may be configured to engage an inner surface of the wall defining the first chamber in the first position to form the seal between the first chamber and the second chamber. An actuator may move the arm relative to the slit. The actuator may be coupled to a proximal end of the arm outside of the second chamber or within the second chamber. The arm may be configured to engage an outer surface of the first chamber in the first position to form the seal between the first chamber and the second chamber.

The pedestal may be fixed to walls defining the first chamber. Walls defining the first chamber may be movable relative to a base defining the first chamber to provide the valve assembly. The pedestal may be suspended from a ceiling of the first chamber.

The gas delivery system may include an exhaust system to exhaust gas within the first chamber, thereby depressurizing the first chamber. The controller may be configured to operate the exhaust system to depressurize the first chamber before the valve assembly is opened. A vacuum processing system may be configured to generate a pressure within the second chamber, the pressure being less than 1 atmosphere.

A heating element may be configured to apply heat to the substrate to anneal the substrate when the substrate is supported on the pedestal. The heating element may be positioned within the pedestal. The heating element may be positioned within walls defining the first chamber.

A robot arm may be configured to transfer the substrate through the valve assembly from the first chamber to the second chamber. A lift pin assembly may lift the substrate from the pedestal.

A semiconductor fabrication apparatus may include a central vacuum chamber having a robot positioned therein, a factory interface module coupled to the central vacuum chamber, a low-pressure substrate processing system coupled to the central vacuum chamber by a first vacuum valve, and the high-pressure processing system described above. The second chamber may be coupled to the central vacuum chamber by a second vacuum valve.

In another aspect, a semiconductor processing method includes introducing a processing gas into a first chamber to process a layer on a substrate and to generate a pressure of at least 10 atmospheres within the first chamber during processing of the layer, and transferring the substrate directly from the first chamber to a second chamber, the second chamber having a pressure less than 1 atmosphere.

Implementations may include one or more of the following features. After introducing the processing gas and before transferring the substrate, the processing gas may be exhausted from the first chamber to reduce the pressure within the first chamber. A slit valve between the first chamber and the second chamber may be opened before transferring the substrate. The substrate may be transferred to the second chamber through the slit valve. Opening the slit valve may include moving an arm from a first position in which the arm and the slit valve form a seal between the first chamber and the second chamber and a second position in which the slit valve is opened. Heat may be applied to the substrate to anneal the substrate after the processing gas is introduced. The substrate may include a silicon material.

Advantages of the foregoing may include, but are not limited to, those described below and herein elsewhere. A high-pressure processing system in accordance to certain aspects can improve thoroughness of processing, e.g., annealing or deposition, of a layer of material on a substrate. For example, by being annealed or deposited in a high pressure environment, the resulting material can more easily infiltrate into complex surface geometry, e.g., etched geometries, on the substrate. As a result, fewer defects may occur during the process.

The details of one or more implementations of the subject matter described in this specification are set forth in the accompanying drawings and the description below. Other potential features, aspects, and advantages will become apparent from the description, the drawings, and the claims.

DETAILED DESCRIPTION

As noted above, some defects can result from incomplete processing of certain regions of a substrate. However, high-pressure processing can improve consistency of processing across the substrate. In particular, annealing or deposition can occur in the high-pressure environment; this can help improve thoroughness of processing of the layer of material. As a result, the layer can be more uniformly formed or modified across the substrate. High-pressure processing can also provide access to chemical reactions that are not available at lower pressures.

Another issue is that certain materials, such as copper, will rapidly oxidize when exposed to oxygen, at temperatures over about 70° C. If the copper or other material oxidizes, the substrate may no longer be useable, or the oxide layer must first be removed before further processing. These are both unacceptable options for efficient manufacturing. Accordingly, a design factor is to isolate the substrate from oxygen, when the substrate temperature is over about 70° C. Since oxygen is of course present in ambient air, avoiding oxidation of copper during annealing also can present engineering challenges. As described herein, the substrate can be transferred between the high-pressure processing chamber and different processing chambers in the low-pressure, e.g., near-vacuum, environment to avoid contamination and oxidation of the substrate.

The temperature uniformity of the wafer is another significant design factor as it affects the crystalline structure of copper or other materials on the wafer. The processing system, e.g., the pedestal configuration, can provide uniform heating of the wafer.

Another consideration is serviceability. It is important to be able to recover or service a chamber as quickly and efficiently as possible. The chamber configurations described herein can be easy to service.

Figure 1:
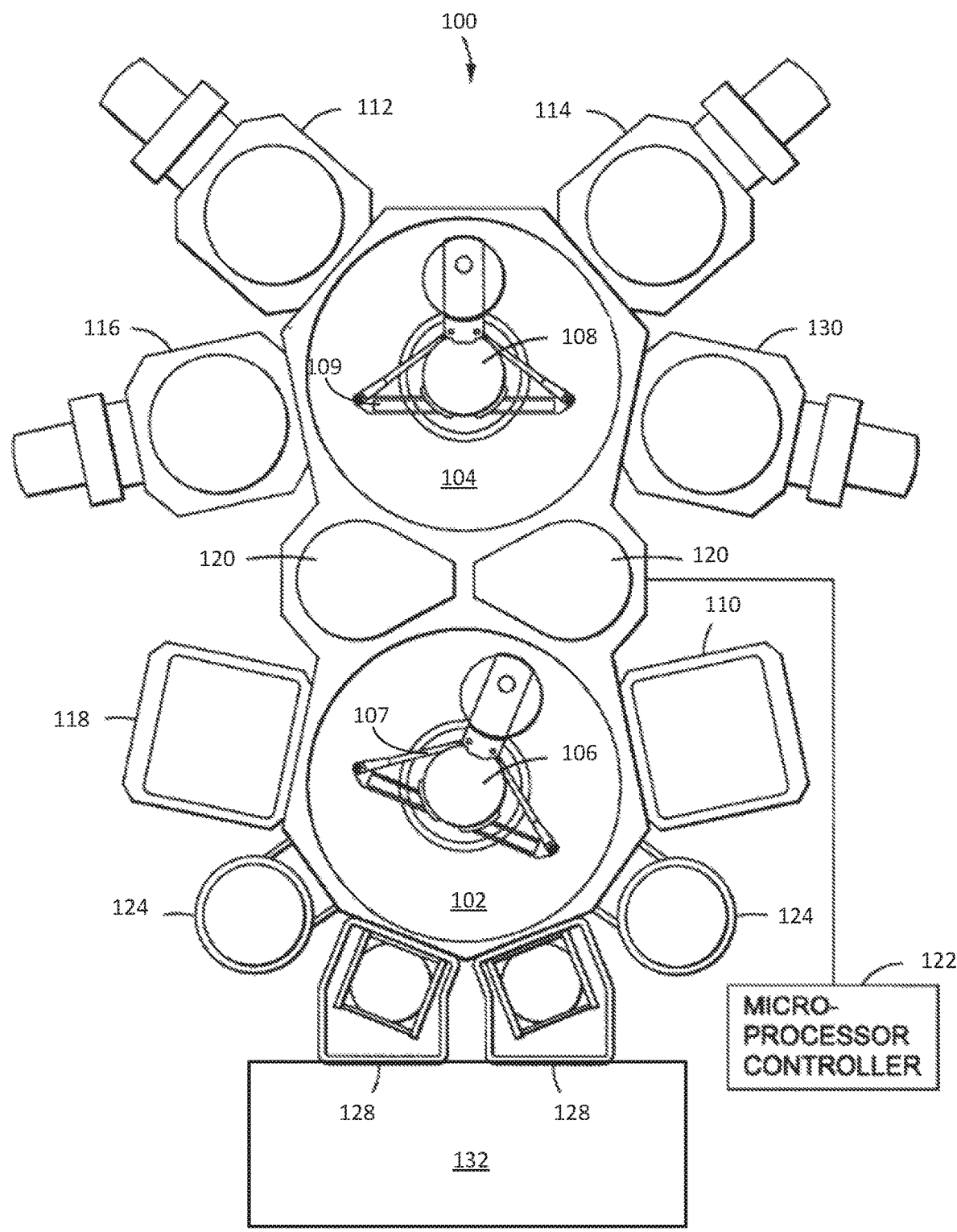
FIG. 1 is a diagram of a processing platform.

FIG. 1 shows an integrated multi-chamber substrate processing system suitable for performing at least one embodiment of the physical vapor deposition, the chemical vapor deposition, and/or annealing processes described herein. In general, the multi-chamber substrate processing system includes at least one high-pressure processing chamber, e.g., able to operate at pressures above 10 atmospheres, to perform a high-pressure process such as deposition or annealing, and at least one low-pressure processing chamber, e.g., able to operate a pressures below about 100 milliTorr, to perform a low-pressure process such as etching, deposition, or thermal treatment. In some implementations the multi-chamber processing system is a cluster tool having a central transfer chamber that is at low pressure and from which multiple processing chambers can be accessed.

Some embodiments of the processes and systems described herein relate to forming layers of material, e.g., metal and metal silicide barriers, for feature definitions. For example, a first metal layer is deposited on a silicon substrate and annealed to form a metal silicide layer. A second metal layer is then deposited on the metal silicide layer to fill the feature. The annealing process to form the metal silicide layer may be performed in multiple annealing steps.

FIG. 1 is a schematic top view of one embodiment of a processing platform 100 including two transfer chambers 102, 104, transfer robots 106, 108 positioned in the transfer chambers 102, 104, respectfully, and processing chambers 110, 112, 114, 116, 118, disposed on the two transfer chambers 102, 104. The first and second transfer chambers 102, 104 are central vacuum chambers that interface with adjacent processing chambers 110, 112, 114, 116, 118. The first transfer chamber 102 and the second transfer chamber 104 are separated by pass-through chambers 120, which may comprise cooldown or pre-heating chambers. The pass-through chambers 120 also may be pumped down or ventilated during substrate handling when the first transfer chamber 102 and the second transfer chamber 104 operate at different pressures. For example, the first transfer chamber 102 may operate between about 100 milliTorr and about 5 Torr, such as about 40 milliTorr, and the second transfer chamber 104 may operate between about $1 \times 10^{-5}$ Torr and about $1 \times 10^{-8}$ Ton, such as about $1 \times 10^{-7}$ Torr.

The processing platform 100 is automated by programming a controller 122. The controller 122 can operate individual operations for each of the chambers of the processing platform 100 to process the substrate.

The first transfer chamber 102 is coupled with two degas chambers 124, two load lock chambers 128, a reactive pre-clean chamber 118, at least one physical vapor deposition chamber, preferably a long throw physical vapor deposition (PVD) chamber 110, and the pass-through chambers 120. The pre-clean chamber may be a PreClean II chamber, commercially available from Applied Materials, of Santa Clara, Calif. Substrates (not shown) are loaded into the processing platform 100 through load lock chambers 128. For example, a factory interface module 132, if present, would be responsible for receiving one or more substrates, e.g., wafers, cassettes of wafers, or enclosed pods of wafers, from either a human operator or an automated substrate handling system. The factory interface module 132 can open the cassettes or pods of substrates, if applicable, and move the substrates to and from the load lock chambers 128. The processing chambers 110, 112, 114, 116, 118 receive the substrates from the transfer chambers 102, 104, process the substrates, and allow the substrates to be transferred back into the transfer chambers 102, 104. After being loaded into the processing platform 100, the substrates are sequentially degassed and cleaned in degas chambers 124 and the pre-clean chamber 118, respectively.

Each of the processing chambers are isolated from the transfer chambers 102, 104 by an isolation valve which allows the processing chambers to operate at a different level of vacuum than the transfer chambers 102, 104 and prevents any gasses being used in the processing chamber from being introduced into the transfer chamber. The load lock chambers 128 are also isolated from the transfer chamber 102, 104 with isolation valves. Each load lock chamber 128 has a door which opens to the outside environment, e.g., opens to the factory interface module 132. In normal operation, a cassette loaded with substrates is placed into the load lock chamber 128 through the door from the factory interface module 132 and the door is closed. The load lock chamber 128 is then evacuated to the same pressure as the transfer chamber 102 and the isolation valve between the load lock chamber 128 and the transfer chamber 102 is opened. The robot in the transfer chamber 102 is moved into position and one substrate is removed from the load lock chamber 128. The load lock chamber 128 is preferably equipped with an elevator mechanism so as one substrate is removed from the cassette, the elevator moves the stack of wafers in the cassette to position another wafer in the transfer plane so that it can be positioned on the robot blade.

The transfer robot 106 in the transfer chamber 102 then rotates with the substrate so that the substrate is aligned with a processing chamber position. The processing chamber is flushed of any toxic gasses, brought to the same pressure level as the transfer chamber, and the isolation valve is opened. The transfer robot 106 then moves the wafer into the processing chamber where it is lifted off the robot. The transfer robot 106 is then retracted from the processing chamber and the isolation valve is closed. The processing chamber then goes through a series of operations to execute a specified process on the wafer. When complete, the processing chamber is brought back to the same environment as the transfer chamber 102 and the isolation valve is opened. The transfer robot 106 removes the wafer from the processing chamber and then either moves it to another processing chamber for another operation or replaces it in the load lock chamber 128 to be removed from the processing platform 100 when the entire cassette of wafers has been processed.

The transfer robots 106, 108 include robot arms 107, 109, respectively, that support and move the substrate between different processing chambers. The transfer robot 106 moves the substrate between the degas chambers 124 and the pre-clean chamber 118. The substrate may then be transferred to the long throw PVD chamber 110 for deposition of a material thereon.

The second transfer chamber 104 is coupled to a cluster of processing chambers 110, 112, 114, 130. The processing chambers 110, 112 may be chemical vapor deposition (CVD) chambers for depositing materials, such as tungsten, as desired by the operator. An example of a suitable CVD chamber includes WxZ™ chambers, commercially available from Applied Materials, Inc., located in Santa Clara, Calif. The CVD chambers are preferably adapted to deposit materials by atomic layer deposition (ALD) techniques as well as by conventional chemical vapor deposition techniques. The processing chambers 114 and 130 may be Rapid Thermal Annealing (RTA) chambers, or Rapid Thermal Process (RTP) chambers, that can anneal substrates at vacuum or near vacuum pressures. An example of a RTA chamber 114 is a RADIANCE™ chamber, commercially available from Applied Materials, Inc., Santa Clara, Calif. Alternatively, the processing chambers 114 and 130 may be WxZ™ deposition chambers capable of performing high temperature CVD deposition, annealing processes, or in situ deposition and annealing processes. The PVD processed substrates are moved from the first transfer chamber 102 into the second transfer chamber 104 via the pass-through chambers 120. Thereafter, the transfer robot 108 moves the substrates between one or more of the processing chambers 110, 112, 114, 130 for material deposition and annealing as required for processing.

RTA chambers (not shown) may also be disposed on the first transfer chamber 102 of the processing platform 100 to provide post deposition annealing processes prior to substrate removal from the platform 100 or transfer to the second transfer chamber 104.

While not shown, a plurality of vacuum pumps is disposed in fluid communication with each transfer chamber and each of the processing chambers to independently regulate pressures in the respective chambers. The pumps may establish a vacuum gradient of increasing pressure across the apparatus from the load lock chamber to the processing chambers.

Alternatively or in addition, a plasma etch chamber, such as a Decoupled Plasma Source chamber (DPS™ chamber) manufactured by Applied Materials, Inc., of Santa Clara, Calif., may be coupled to the processing platform 100 or in a separate processing system for etching the substrate surface to remove unreacted metal after PVD metal deposition and/or annealing of the deposited metal. For example, in forming cobalt silicide from cobalt and silicon material by an annealing process, the etch chamber may be used to remove unreacted cobalt material from the substrate surface.

Other etch processes and apparatus, such as a wet etch chamber, can be used in conjunction with the process and apparatus described herein.

Figure 2:
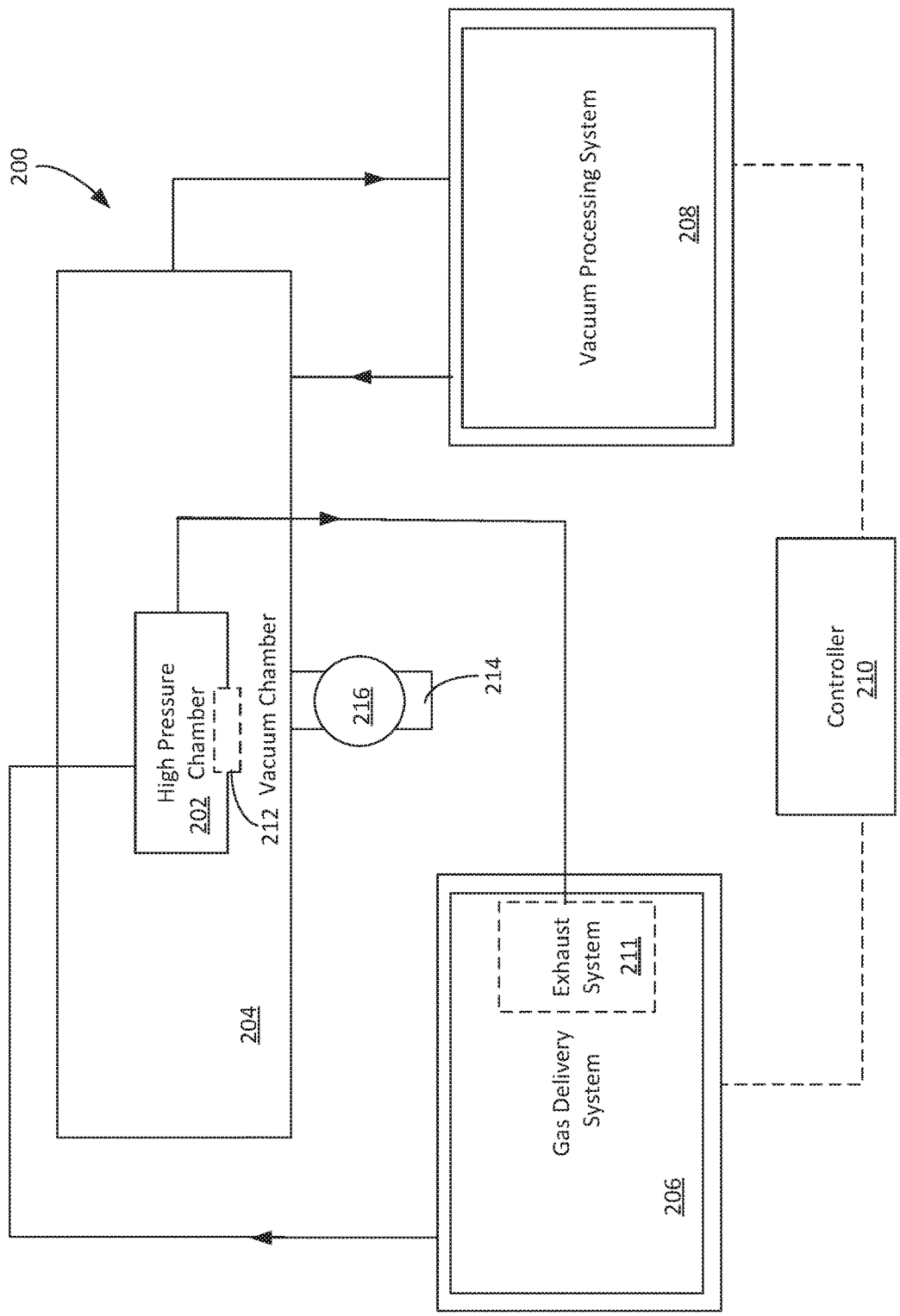
FIG. 2 is a diagram of a high-pressure system.

FIG. 2 illustrates a controlled high-pressure system 200 that creates a high-pressure environment for processing a substrate and a low-pressure environment for the substrate when the substrate is being transferred between processing chambers. The controlled high-pressure system 200 includes a first high-pressure chamber 202 and a second vacuum chamber 204. The first chamber 202 can correspond to one of the processing chambers 110, 112, 114, 116, 118, 130 of the processing platform 100, and the second chamber 204 can correspond to one of the transfer chambers 102, 104 of the processing platform 100. Alternatively, in some implementations, one of the processing chambers 110, 112, 114, 116, 118, 130 includes both the first chamber 202 and the second chamber 204. The first chamber 202 corresponds to an inner chamber, and the second chamber 204 corresponds to an outer chamber surrounding the inner chamber.

The pressure within the first chamber 202 can be controlled independently of the pressure in the second chamber 204. If the first and second chambers 202, 204 are distinct from the transfer chambers, the first and second chambers 202, 204 can have pressures that are controlled independently of the pressures within the transfer chambers. The controlled high-pressure system 200 further includes a gas delivery system 206, a vacuum processing system 208, and a controller 210. In some examples, the controller 122 of the processing platform 100 can include the controller 210.

The second chamber 204 is a low pressure chamber adjacent to the first chamber 202. In some implementations, the second chamber 204 also surrounds the first chamber 202. The second chamber 204 can correspond to a transfer chamber, e.g., the transfer chamber 102 or the transfer chamber 104, that receives the substrate between different processing chambers. The low pressure environment of the second chamber 204 can inhibit contamination and/or oxidation of the substrate or the material formed on the substrate.

The gas delivery system 206 is operated to pressurize and depressurize the first chamber 202. The first chamber 202 is a high-pressure processing chamber that receives a processing gas from the gas delivery system 206 and establishes a high pressure, e.g., at a pressure of at least 10 atmospheres. The processing gas can interact with the layer being processed so as to anneal the layer, e.g., by modifying the layer or reacting with the material to form a new layer. The processing gas can include hydrogen, e.g., the processing gas can be hydrogen gas $H_2$. Alternatively, the processing gas can be a precursor gas that serves as a source for the material to be formed on the substrate, e.g., for a deposition process. To pressurize the first chamber 202, the gas delivery system 206 introduces the processing gas into the first chamber 202. In some cases, the gas delivery system 206 can also introduce steam into the first chamber 202 to increase the pressure within the first chamber 202.

The gas delivery system 206 can include an exhaust system 211 to exhaust the processing gas from the first chamber 202, thereby depressurizing the first chamber 302. The vacuum processing system 208 is operated to control the pressure of the second chamber 204 to be at a vacuum or near-vacuum pressure, e.g., less than 1 milliTorr. For example, the vacuum processing system 208 lowers a pressure within the second chamber 204 to near vacuum, thereby creating the appropriate low pressure environment for transfer of the substrate.

A valve assembly 212 between the first chamber 202 and the second chamber 204 isolates the pressure within the first chamber 202 from the pressure within the second chamber 204. The high-pressure environment within the first chamber 202 can thus be separated and sealed from the low pressure environment within the second chamber 204. The valve assembly 212 is openable to enable the substrate to be transferred from the first chamber 202 directly into the second chamber 204 or to enable the substrate to be transferred from the second chamber 204 directly into the first chamber 202.

In some implementations, the high-pressure system 200 includes a foreline 214 connected to a transfer chamber, e.g., one of the transfer chambers 102, 104, and connected to an outside environment. An isolation valve 216 is arranged along the foreline 214 to isolate the pressure within the second chamber 204 from the pressure of the outside environment. The isolation valve 216 can be operated to adjust the pressure within the second chamber 204 and to release gases within the second chamber 204. The isolation valve 216 can be operated in conjunction with the vacuum processing system 208 to regulate the pressure within the second chamber 204.

FIGS. 3-6 depict various embodiments of high-pressure processing systems for processing a layer on a substrate. The pressure of chambers of these high-pressure processing systems can be controlled using systems similar to those described with respect to FIG. 2.

Figure 3:
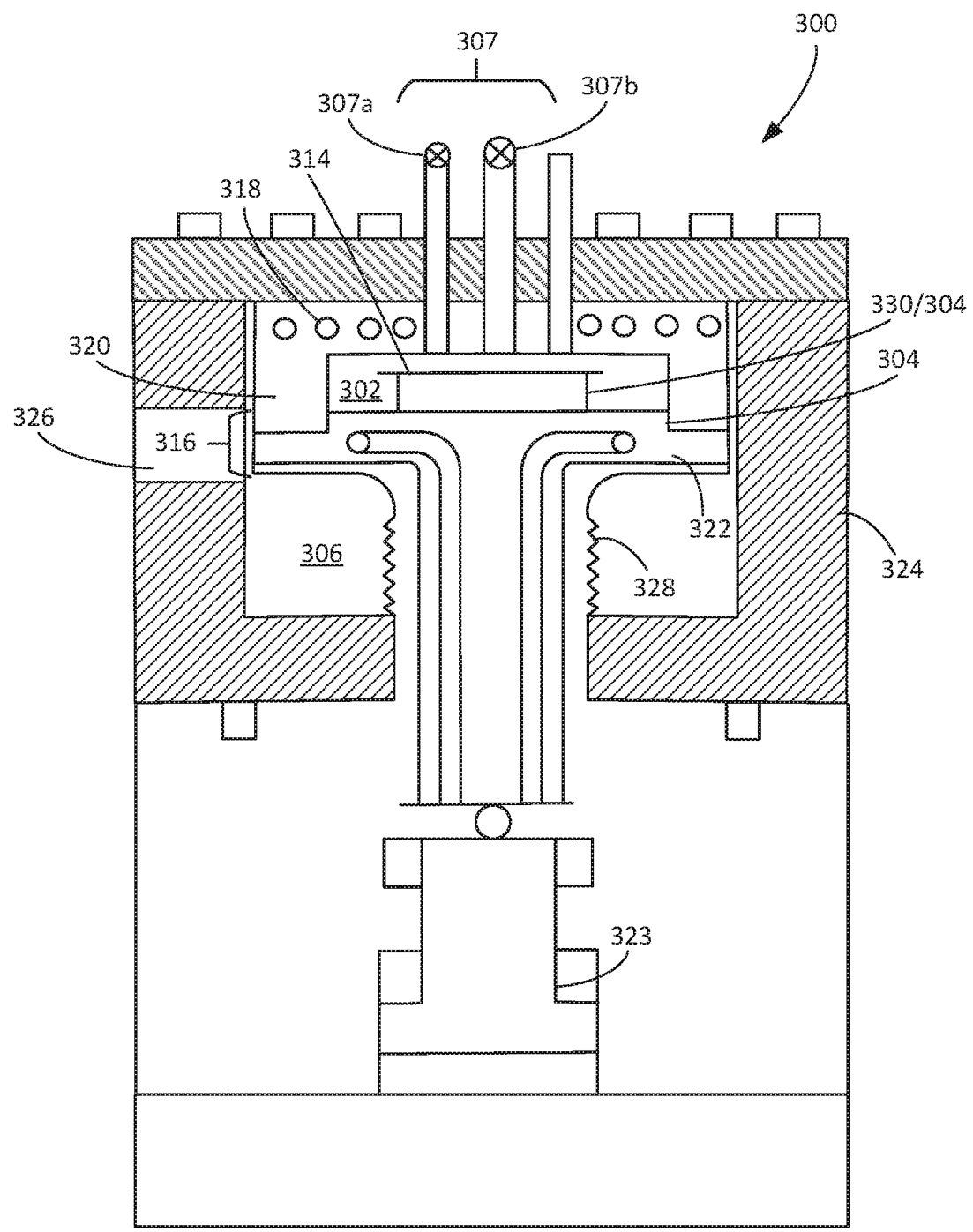
FIG. 3 is a schematic side view of an example of a high-pressure processing system.

Referring to FIG. 3, a high-pressure processing system 300 includes a first chamber 302, a pedestal 304, a second chamber 306, and a controller (e.g., the controller 122). The high-pressure processing system 300 further includes a vacuum processing system (not shown) similar to the vacuum processing system 208 and a gas delivery system 307 similar to the gas delivery system 206 described with respect to FIG. 2. For example, the gas delivery system 307 includes an input line 307a and an exhaust line 307b. The processing gas is introduced into the first chamber 302 through the input line 307a, and the processing gas is exhausted from the first chamber 302 through the exhaust line 307b.

The pedestal 304 supports a substrate 314 on which a layer of material is to be processed, e.g., annealed or deposited. The pedestal 304 is positioned or positionable within the first chamber 302. In some implementations, the substrate 314 sits directly on a flat top surface of the pedestal. In some implementations, the substrate 314 sits on pins 330 that project from the pedestal.

The high-pressure processing system 300 includes an inner wall 320, a base 322, and an outer wall 324. The first chamber 302 is provided by a volume within the inner wall 320, e.g., between the inner wall 320 and the base 322. The second chamber 306 is provide by a volume outside the inner wall 320, e.g., between the inner wall 320 and the outer wall 324.

The high-pressure processing system 300 further includes a valve assembly 316 between the first chamber 302 and the second chamber 306 that provides the functionality of the valve assembly 212 of FIG. 2, i.e., it can be operated to isolate the first chamber 302 from the second chamber 306. For example, the valve assembly 316 includes the inner wall 320, the base 322, and an actuator 323 to move the base 322 relative to the inner wall 320. The actuator 323 can be controlled to drive the base 322 to move vertically, e.g., away from or toward the walls 320 defining the first chamber 302. A bellows 328 can be used to seal the second chamber 306 from the external atmosphere while permitting the base 322 to move vertically. The bellows 328 can extend from a bottom of the base 322 to a floor of the second chamber 306 formed by the outer wall 324.

When the valve assembly 316 is in a closed position, the base 322 contacts the walls 320 such that a seal is formed between the base 322 and the walls 320, thus separating the second chamber 306 from the first chamber 302. The second chamber 306 may be referred to as an outer chamber and the first chamber 302 may be referred to as an inner chamber. The actuator 323 is operated to drive the base 322 toward the inner walls 320 with sufficient force to form the seal. The seal inhibits air from the first high-pressure chamber 302 from being exhausted into the low-pressure second chamber 306.

When the valve assembly 316 is in an open position, the base 322 is spaced apart from the walls 320, thereby allowing air to be conducted between the first and second chambers 302, 306 and also allowing the substrate 314 to be accessed and transferred to another chamber.

Because the pedestal 304 is supported on the base 322, the pedestal 304 is thus also movable relative to the inner walls 320. The pedestal 304 can be moved to enable the substrate 314 to be more easily accessible by the transfer robot. For example, an arm of a transfer robot 106 or 108 (see FIG. 1) can extend through an aperture (or slit) 326 in the outer wall 324. When the valve assembly 316 is in the open position, the robot arm can pass through the gap between the inner wall 320 and the base 322 to access the substrate 314.

In some implementations, the high-pressure processing system 300 includes one or more heating elements 318 configured to apply heat to the substrate 314. The heat from the heating elements 318 can be sufficient to anneal the substrate 314 when the substrate 314 is supported on the pedestal 304 and the processing gas (if used) has been introduced into the first chamber 302. The heating elements 318 may be resistive heating elements. The one or more heating elements 318 may be positioned in, e.g., embedded in, the inner walls 320 defining the first chamber 302, e.g., in a ceiling of the first chamber 302 provided by the inner walls 320. This heats the inner wall 320, causing radiative heat to reach the substrate 314. The substrate 314 can be held by the pedestal 304 in close proximity, e.g., 2-10 mm, to the ceiling to improve transmission of heat from the inner wall 320 to the substrate 314.

However, the one or more heating elements 318 may be arranged in other locations within the high-pressure processing system 300, e.g., within the side walls rather than the ceiling. An example of a heating element 318 includes a discrete heating coil. Instead of or in addition to a heater embedded in the inner wall, a radiative heater, e.g., an infrared lamp, can be positioned outside the first chamber 302 and direct infrared radiation through a window in the inner wall 320. Electrical wires connect an electrical source (not shown), such as a voltage source, to the heating element, and can connect the one or more heating elements 318 to the controller.

The controller is operably connected to the vacuum processing system, the gas delivery system 307, and the valve assembly 316 for controlling operations to process, e.g., anneal or deposit, the layer of material on the substrate 314. In some implementations, the controller may also be operably connected to other systems. For example, the controller can also be operably connected to one or more of the transfer robots 106, 108, the one or more heating elements 318, and/or the actuator 323. In some cases, the controller 122 shown in FIG. 1 includes the controller of the high-pressure processing system 300.

In processing a layer of material on the substrate 314, the controller can operate the vacuum processing system to depressurize the second chamber 306 to a low-pressure state, e.g., to a state in which the second chamber 306 has a pressure less than 1 atmosphere, to prepare for transfer of the substrate 314 through the second chamber 306. The low-pressure state can be a near-vacuum state, e.g., a pressure less than 1 milliTorr. The substrate 314 is moved through the second chamber 306 by a transfer robot, e.g., one of the transfer robots 106, 108, while the second chamber 306 is at the low-pressure so that contamination and oxidation of the substrate 314 can be inhibited. The double walls can help ensure safer processing, e.g., annealing.

The substrate 314 is transferred into the first chamber 302 for processing. To transfer the substrate 314 into the first chamber 302, the controller can operate the valve assembly 316, e.g., open the valve assembly 316 to provide an opening through which the substrate 314 can be transferred into the first chamber 302. The controller can operate the transfer robot to carry the substrate 314 into the first chamber 302 and to place the substrate 314 on the pedestal 304.

After the substrate 314 is transferred into the first chamber 302, the controller can operate the valve assembly 316 to close the opening, e.g., close the valve assembly 316, thereby isolating the first and second chambers 302, 306 from one another. With the valve assembly 316 closed, pressures in the first chamber 302 and the second chamber 306 can be set to different values. The controller can operate the gas delivery system 307 to introduce the processing gas into the first chamber 302 to pressurize the first chamber 302 and to form the layer of material onto the substrate 314. The introduction of the processing gas can increase the pressure within the first chamber 302 to, for example, 10 atmospheres or more.

In some implementations, the processing gas interacts with the material on the substrate as to anneal the material, e.g., by modifying the layer or reacting with the material to form a new layer. Alternatively, the processing gas can include the material to be deposited onto the substrate 314, and the proper temperature and pressure conditions in the first chamber 302 can cause the deposition of the material to occur. During the processing of the substrate, the controller can operate the one or more heating elements 318 to add heat to the substrate 314 to facilitate deposition of the layer of material on the substrate 314.

When modification or formation of the layer of material on the substrate 314 is complete, the substrate 314 can be removed from the first chamber 302 using the transfer robot and, if necessary, transferred to a subsequent process chamber. Alternatively, the substrate 314 is transferred into a load lock chamber, e.g., one of the load lock chambers 128. To prepare for transfer of the substrate 314 out of the first chamber 302, the controller can operate the exhaust system of the gas delivery system 307 to depressurize the first chamber 302 before the valve assembly 316 is opened. In particular, before the substrate 314 is transferred out of the first chamber 202, the processing gas is exhausted from the first chamber 302 to reduce the pressure within the first chamber 202. The pressure can be reduced to a near-vacuum pressure such that the pressure differential between the first chamber 302 and the second chamber 306 can be minimized.

To enable the substrate 314 to be transferred out of the first chamber 302, the controller can open the valve assembly 316. The opened valve assembly 316 provides an opening through which the substrate 314 is moved to be transferred into the second chamber 306. In particular, the opened valve assembly 316 enables the substrate 314 to be transferred directly into the second chamber 306, e.g., into the low pressure environment of the second chamber 306. The controller can then operate the transfer robot to transfer the substrate 314 to another portion of a processing platform, e.g., the processing platform 100. For example, the substrate 314 is first transferred directly into the second chamber 306 and then is transferred to the appropriate processing chamber for further processing or to the load lock chamber to remove the substrate from the processing platform.

Figure 4:
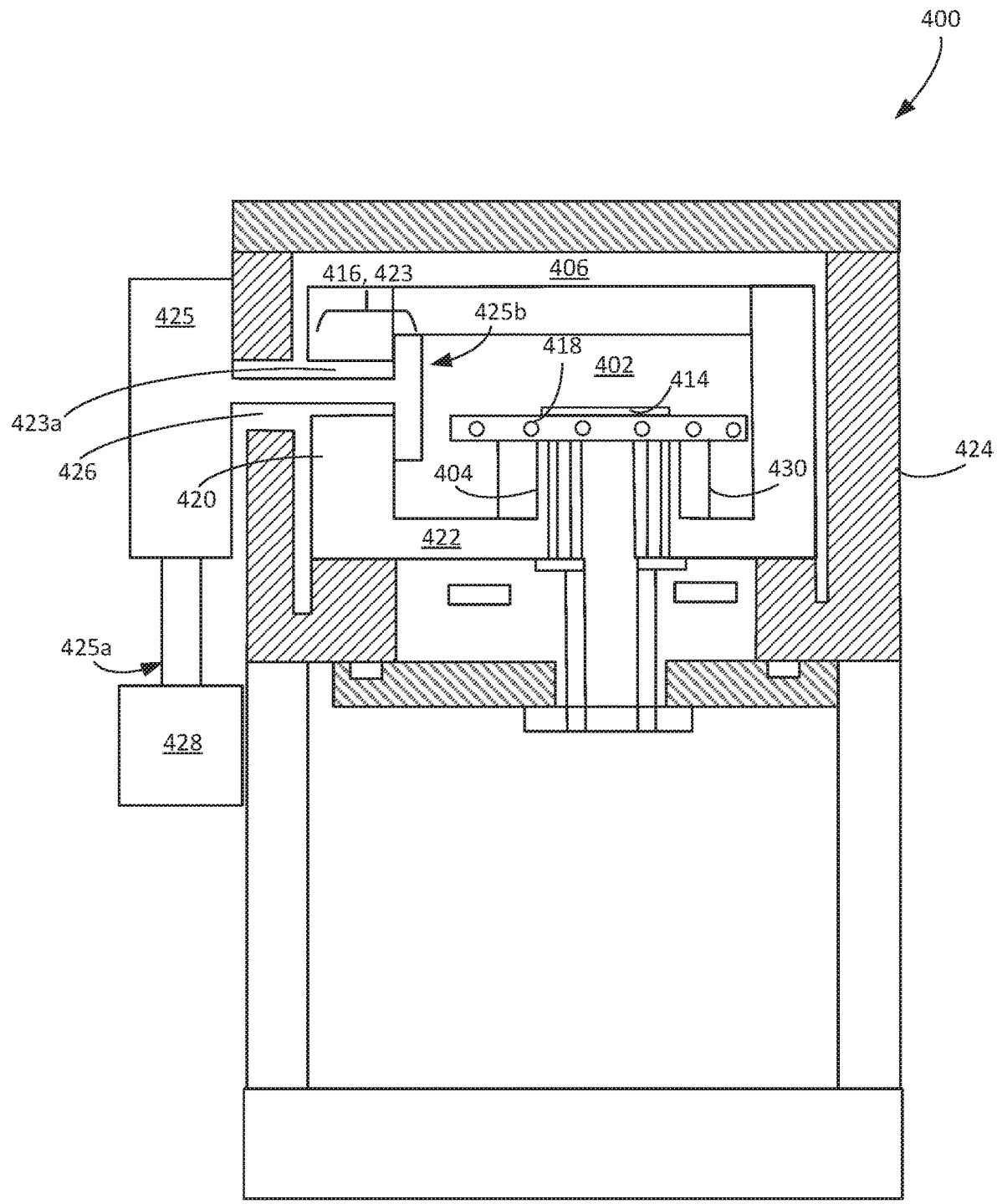
FIG. 4 is a schematic side view of another example of a high-pressure processing system.

Referring to FIG. 4, in another embodiment, a high-pressure processing system 400 includes a first chamber 402, a pedestal 404, a second chamber 406, and a controller (not shown). The high-pressure processing system 400 is similar to the high-pressure processing system 300 described with respect to FIG. 3; unless otherwise specified the various options and implementations are also applicable to this embodiment.

For example, the gas delivery system and the vacuum processing system of the high-pressure processing system 400 are operated in a similar manner to maintain the low and high pressure environments for a substrate 414 processed using the high-pressure processing system 400. The second chamber 406 can be defined by volume between inner walls 420 and outer walls 424. In addition, the substrate 414 is also supportable on the pedestal 404 for processing within the first chamber 402. Again, the substrate can sit directly on the pedestal 404, or sit on lift pins 430 that extend through the pedestal.

The high-pressure processing system 400 differs from the high-pressure processing system 300 of FIG. 3 in a few regards. First, inner walls 420 defining the first chamber 402 are not movable relative to a base 422 defining the first chamber 402. The pedestal 404 is thus fixed relative to the inner walls 420 and the base 422. In some examples, the pedestal 404 is fixed to the base 422 defining the first chamber 402.

Rather than being arranged in the walls 420 of the first chamber 402, as is the case for the one or more heating elements 318 of the embodiment of FIG. 3, one or more heating elements 418 of the embodiment depicted in FIG. 4 are arranged within the pedestal 404. The substrate 414 is thus heated through contact with the pedestal 404.

The high-pressure processing system 400 further includes a valve assembly 416 between the first chamber 402 and the second chamber 406 that, similar to the valve assembly 316 of FIG. 3, isolates the first chamber 402 from the second chamber 406. However, in contrast to the valve assembly 316, the valve assembly 416 is not formed by the walls 420 and the base 422 defining the first chamber 402, but rather is formed by an arm 425 movable relative to the inner walls 420 and the base 422 of the first chamber 402. The arm 425 may be movable relative to the outer walls 424 and the base 422 of the first chamber 402.

In particular, the valve assembly 416 includes a slit valve 423 between the first chamber 402 and the second chamber 406. The slit valve 423 includes a slit 423*a* and the arm 425. The slit 423*a* extends through one of the inner walls 420 of the first chamber 402. A proximal end 425*a* of the arm 425 is positioned outside of the first chamber 402 while a distal end 425*b* of the arm 425 is positioned within the first chamber 402. The proximal end 425*a* of the arm 425 can be positioned within the second chamber 406 and be driven by an actuator positioned within the second chamber 406. Alternatively, the proximal end 425*a* of the arm 425 is positioned outside of the second chamber 406 and is thus driven by an actuator 428 that is also positioned outside of the second chamber 406.

The arm 425 extends through the slit 423*a* and is movable relative to the walls 420 so that the arm 425 can be moved to a position in which it forms a seal with the walls 420. The actuator 428 is coupled to the proximal end 425*a* of the arm 425 and drives the distal end 425*b* of the arm 425 relative to the walls 420. The arm 425 is also movable vertically to cover or uncover the slit 423*a*. In particular, the proximal end 425*a* of the arm 425 can be or include a flange that extends substantially parallel to the adjacent inner surface of the inner wall 420. The arm 425 is also movable and driven laterally so that the distal end 425*b* of the arm 425 can engage or disengage the wall 420.

The arm 425 can also extend through a slit (or aperture) 426 in the outer wall 424.

Like the valve assembly 316, the valve assembly 416 is movable between an open position and a closed position. When the valve assembly 416 is in the closed position, the distal end 425*b* of the arm 425 covers the slit 423*a* and contacts one of the walls 420, thereby forming the seal to isolate the first chamber 402 from the second chamber 406. In particular, the distal end 425*b* of the arm 425, e.g., the flange, contacts an inner surface of the wall 420 defining the first chamber 402.

When the valve assembly 416 is in the open position, the distal end 425*b* of the arm 425 is spaced laterally apart from the wall 420, e.g., the inner surface of the wall 420. In addition, the distal end 425*b* of the arm 425 is positioned vertically so that the slit 423*a* is uncovered. The slit 423*a* thus provides an opening that enables fluidic communication between the first chamber 402 and the second chamber 406 and that also enables the substrate 414 to be moved in and out of the first chamber 402, e.g., by a robot as discussed above.

The controller can operate the high-pressure processing system 400 in a manner similar to the process described with respect to the controller of the high-pressure processing system 300 to transfer the substrate 414 into and out of the first chamber 402 and to form the layer of material on the substrate 414. In this process, to open and close the valve assembly 416, the controller can operate the actuator 428 to drive the arm 425.

An advantage of the configuration shown in FIG. 4 is that the pressure within the first chamber 402 helps force the distal end 425*b* of the arm 425 against the inner surface of the inner wall 420. Consequently, in contrast to the configuration shown in FIG. 3, the actuator can be less powerful.

Figure 5:
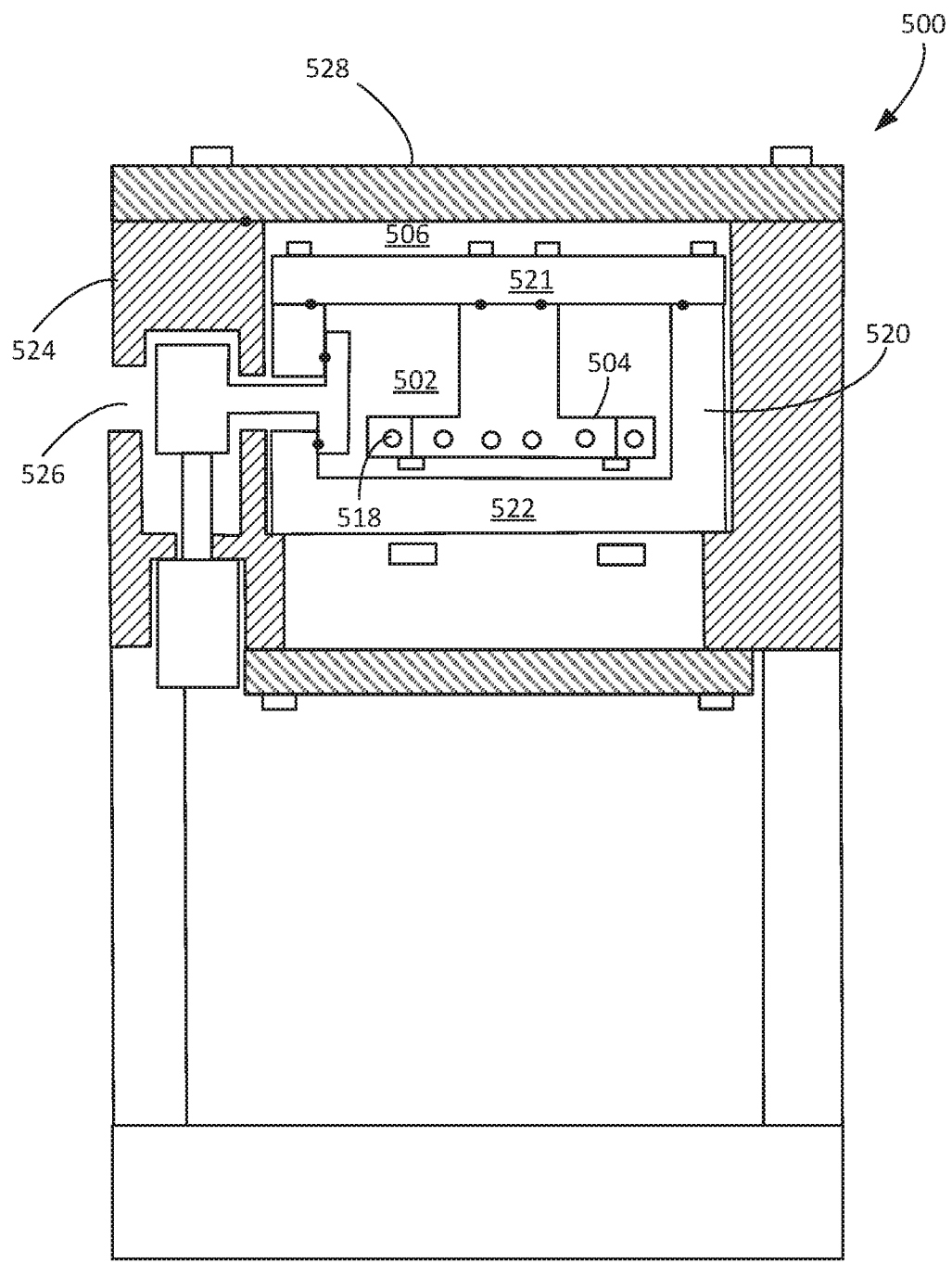
FIG. 5 is a schematic side view of another example of a high-pressure processing system.

Referring to FIG. 5, in a further embodiment, a high-pressure processing system 500 includes a first chamber 502, a pedestal 504, a second chamber 506, and a controller (not shown). The high-pressure processing system 500 is similar to the high-pressure processing system 400 described with respect to FIG. 4; unless otherwise specified the various options and implementations are also applicable to this embodiment.

For example, the gas delivery system and the vacuum processing system of the high-pressure processing system 500 are operated in a similar manner to maintain the low and high pressure environments for a substrate (not shown) processed using the high-pressure processing system 500. In addition, the substrate is also supportable on the pedestal 504 or lift pins for processing within the first chamber 502.

The high-pressure processing system 500 differs from the high-pressure processing system 400 of FIG. 4 in that the pedestal 504 is mounted to a ceiling 521 defining the first chamber 502 rather than to a base 522 defining the first chamber 502. Like the pedestal 404, the pedestal 504 is fixed relative to the walls 520, the ceiling 521, and the base 522. In addition, one or more heating elements 518 of the high-pressure processing system 500 are arranged within the pedestal 504. To position the substrate on the pedestal 504 such that the substrate is supported on the pedestal 504, the substrate is inserted between plates of the pedestal 504. The one or more heating elements 518 are arranged relative to the plates such that, when the substrate is inserted into a slot defined by the plates of the pedestal 504, the one or more heating elements 518 can uniformly apply heat to the substrate.

An advantage of the configuration of FIG. 5 is that the first (e.g., inner) chamber 502 is more easily accessed for maintenance or repair. In particularly, to access the pedestal 504, a top lid 528 of the outer wall 524 can be removed. Then the ceiling 521 and pedestal 504 can be removed as a unit.

Figure 6:
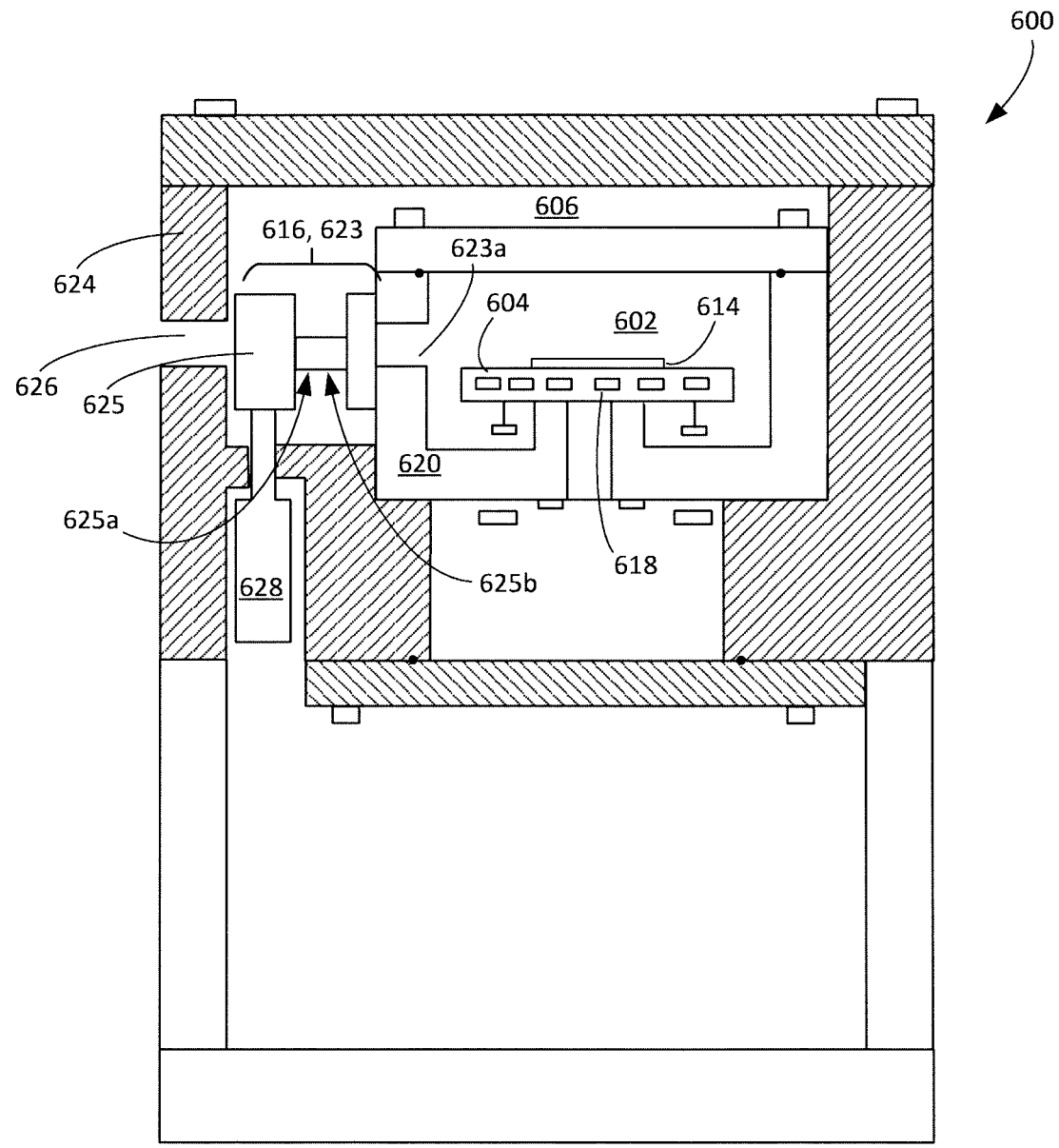
FIG. 6 is a schematic side view of another example of a high-pressure processing system.

Referring to FIG. 6, in a further embodiment, a high-pressure processing system 600 includes a first chamber 602, a pedestal 604 with heating elements 618, a second chamber 606, and a controller (not shown). The high-pressure processing system 600 is similar to the high-pressure processing system 400 described with respect to FIG. 4; unless otherwise specified the various options and implementations are also applicable to this embodiment.

For example, the gas delivery system and the vacuum processing system of the high-pressure processing system 600 are operated in a similar manner to maintain the low and high pressure environments for a substrate 614 processed using the high-pressure processing system 600. In addition, the substrate 614 is also supportable on the pedestal 604 for processing within the first chamber 602.

The high-pressure processing system 600 differs from the high-pressure processing system 400 of FIG. 4 in that an arm 625 of a valve assembly 616 of the high-pressure processing system 600 contacts an outer surface of an inner wall 620 defining the first chamber 602, rather than an inner surface of the inner wall 620, to cover an slit (or aperture) 623a in the inner wall 620. Like the valve assembly 416, the valve assembly 616 operates to isolate the first chamber 602 from the second chamber 606. The valve assembly 616 can be positioned between the first chamber 602 and the second chamber 606.

The valve assembly 616 includes a slit valve 623 between the first chamber 602 and the second chamber 606. The slit valve 623 includes an aperture 623a, e.g., a slit, and the arm 625. The slit 623a extends through one of the inner walls 620 that provide the first chamber 602. A proximal end 625a of the arm 625 is positioned outside of the first chamber 602. Rather than being positioned within the first chamber 602 as is the case for the arm 425, a distal end 625b of the arm 625 is positioned outside of the first chamber 602. Thus, the arm 625 does not extend through the aperture 623a.

The arm 625 is movable relative to the walls 620 so that the arm 625 can be moved to a position in which it forms a seal with the walls 620. For example, the high-pressure processing system 600 includes an actuator 628 operable to drive the arm 625. The actuator 628 is coupled to the proximal end 625a of the arm 625 and is driven to move the distal end 625b of the arm 625 relative to the walls 620.

Like the valve assembly 316, the valve assembly 616 is movable between an open position and a closed position. For example, when the valve assembly 616 is in the closed position, the distal end 625b of the arm 625 contacts one of the walls 620, thereby forming the seal to isolate the high pressure in the first chamber 602 from the low pressure in the second chamber 606. In particular, the distal end 625b of the arm 625 contacts an outer surface of the wall 620 defining the first chamber 602 and is positioned to cover the aperture 623a.

When the valve assembly 616 is in the open position, the distal end 625b of the arm 625 does not contact the wall 620, e.g., the outer surface of the wall 620. The aperture 623a thus provides an opening that enables fluidic communication between the first chamber 602 and the second chamber 606 and that also enables the substrate 614 to be moved in and out of the first chamber 602.

The controller can operate the high-pressure processing system 600 in a manner similar to the process described with respect to the controller of the high-pressure processing system 300 to transfer the substrate 614 and to form the layer of material on the substrate 614. In this process, to open and close the valve assembly 616, the controller can operate the actuator 628 to drive the arm 625.

An advantage of the configuration shown in FIG. 6 is that the aperture 623a is relatively small, e.g., as compared to the base 322 in the configuration shown in FIG. 3. As such, when high pressure is established in the first chamber 602, less force is needed to hold the valve in the closed position. Consequently, in contrast to the configuration shown in FIG. 3, the actuator can be less powerful.

Figure 7:
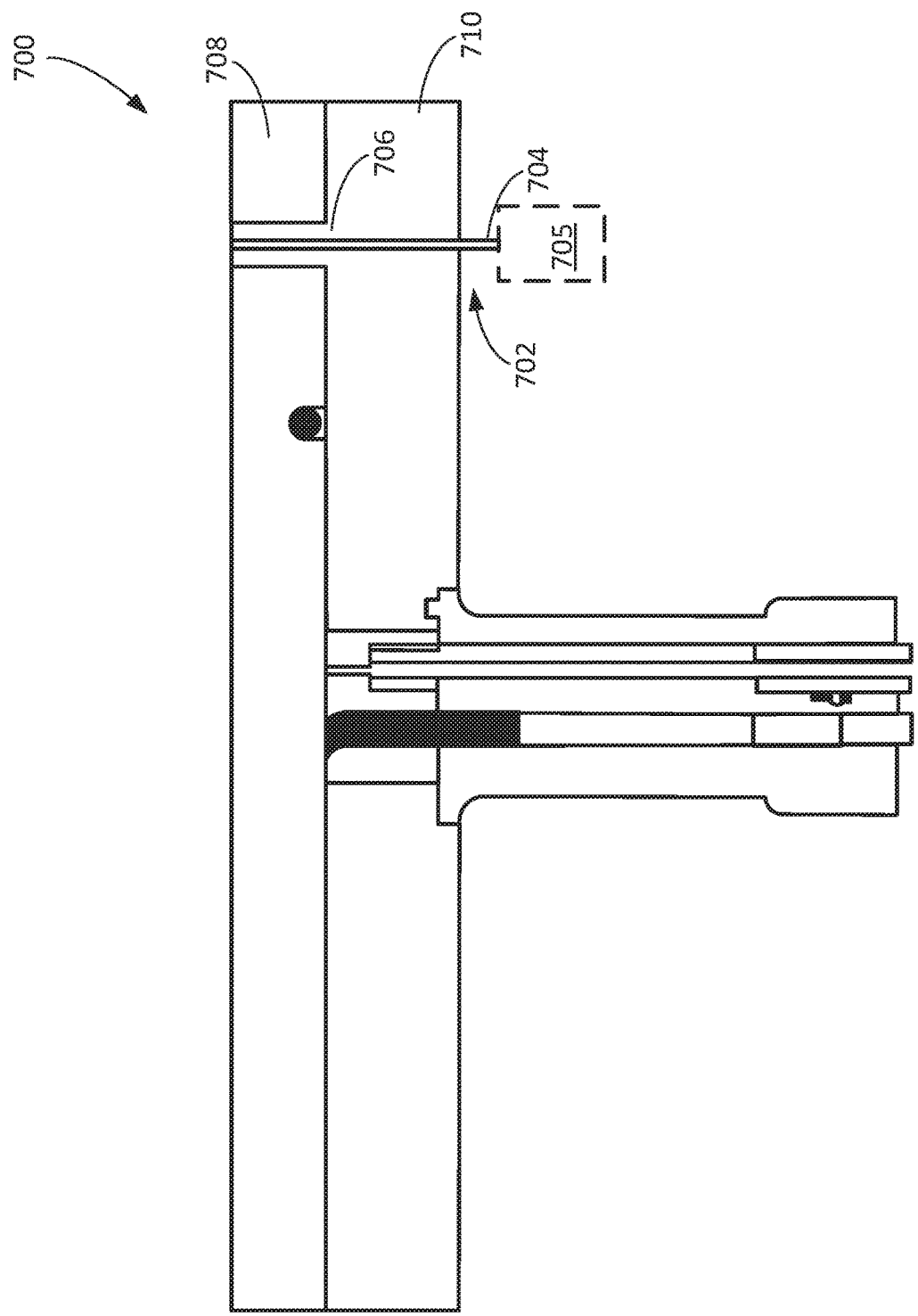
FIG. 7 is a schematic side view of a pedestal.

FIG. 7 illustrate a pedestal 700 with heating elements in accordance to certain embodiments. The pedestal 700 can, for example, correspond to one of the pedestals 404, 504, 604. The pedestal 700 includes a lift pin assembly 702 having a lift pin 704, which is disposed at least partially in an opening 706 defined in plates 708, 710. The lift pin 704 is used to lift the substrate from the pedestal 700 such that a transfer robot, e.g., one of the transfer robots 106, 108, can access and move the substrate out of a chamber, e.g., the first chamber 202, 302, 402, 502, or 602. The lift pin 704 is driven by an actuator 705 from a first position in which the lift pin 704 is recessed within the pedestal 700 to a second position in which the lift pin 704 protrudes from the pedestal 700. In the second position, the lift pin 704 supports a substrate on the pedestal 700 above the pedestal, thereby providing sufficient height above the pedestal 700 for the transfer robot to grasp the substrate.

Controllers and computing devices can implement these operations and other processes and operations described herein. A controller, e.g., the controller 122, 210 or one of the controllers of the high-pressure processing systems 300, 400, 500, or 600, can include one or more processing devices connected to the various components, systems, and subsystems of the high pressure systems described herein.

The controller and other computing devices part of systems described herein can be implemented in digital electronic circuitry, or in computer software, firmware, or hardware. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

A number of implementations have been described. Nevertheless, it will be understood that various modifications may be made. For example:

- The processing system can be used for metal annealing, e.g., annealing of copper or cobalt. For such an annealing process, the processing gas can be hydrogen gas ($H_2$) or deuterium gas ($D_2$).
- The processing system can be used for annealing of silicon dioxide ($SiO_2$). For such an annealing process, the processing gas can be water vapor or steam.
- The processing system can be used for annealing of silicon-germanium material. For such an annealing process, the processing gas can be deuterium gas (D2).
- While formation of a metal silicide layer from a cobalt or nickel layer film is described above, in some implementations, other materials can be used. For example, other materials can include titanium, tantalum, tungsten, molybdenum, platinum, iron, niobium, palladium, and combinations thereof, and other alloys including nickel cobalt alloys, cobalt tungsten alloys, cobalt nickel tungsten alloys, doped cobalt and nickel alloys, or nickel iron alloys, to form a metal silicide material.

Although described above in the context of a system for forming a layer, depending on the gasses provided, the high-pressure chamber can be used for etching system. Alternatively, the high-pressure chamber can be filled with an inert gas, and the high-pressure chamber can be used purely for heat treatment at high pressure.

The processing platforms described herein can include other types of processing chambers. For example, a processing platform can include an etching chamber to etch patterns onto a surface of a substrate.

Each of the different chambers of a processing platform can have varying pressure environments, ranging from near-vacuum to more than 10 atmospheres. The isolation valves, e.g., vacuum valves, between the chambers can isolate the pressures from one another such that these varying pressure environments can be maintained within each chamber.

In some situations, e.g., where a film that does not need to be isolated from the atmosphere is formed, the high-pressure processing system illustrated in FIGS. 2-6 could be a stand-alone system rather than integrated into a multi-chamber system. In this case, the low-pressure chamber would still be useful for isolating the high-pressure chamber from the external environment, e.g., in the case of leaks.

Accordingly, other implementations are within the scope of the claims.

What is claimed is:

1. A high-pressure processing system comprising:
a first chamber having a support to hold a substrate during processing;
a second chamber; and
a gas delivery system configured to pressurize and depressurize the first chamber, the gas delivery system comprising:
an exhaust line passing through a top of the first chamber and a top of the second chamber; and
an input line passing through the top of the first chamber and the top of the second chamber.

2. The high-pressure processing system of claim 1 further comprising a valve assembly disposed between the first chamber and the second chamber and configured to isolate the first chamber from the second chamber.

3. The high-pressure processing system of claim 1, wherein the second chamber at least partially surrounds the first chamber.

4. The high-pressure processing system of claim 1, wherein the gas delivery system is configured to depressurize the first chamber by removing a gas from the first chamber via the exhaust line, and to pressurize the first chamber by introducing the gas into the first chamber via the input line.

5. The high-pressure processing system of claim 1, wherein pressurizing the first chamber comprises increasing a pressure of the first chamber to at least about 10 atmospheres.

6. The high-pressure processing system of claim 1, wherein depressurizing the second chamber comprises decreasing a pressure of the first chamber to be less than or equal to about 1 atmosphere.

7. The high-pressure processing system of claim 1 further comprising a vacuum processing system configured to control a pressure of the second chamber.

8. The high-pressure processing system of claim 2, wherein the valve assembly comprises:

a slit that passes through a wall between the first chamber and the second chamber; and
an arm configured cover and uncover the slit.

9. The high-pressure processing system of claim 4, wherein the gas is one of a processing gas and steam.

10. A method for operating a processing system, the method comprises:
depressurizing a first chamber to equalize a pressure of the first chamber with a pressure of a second chamber;
loading a substrate on a pedestal of a first chamber by passing the substrate through the second chamber; and
introducing a gas into the first chamber to increase the pressure of the first chamber relative to the pressure of the second chamber.

11. The method of claim 10, wherein a valve assembly is configured to isolate the first chamber from the second chamber, and wherein the method further comprises:
closing the valve assembly to isolate the first chamber from the second chamber after transferring the substrate into the first chamber.

12. The method of claim 10, wherein the gas is one of steam and a processing gas.

13. The method of claim 10, wherein depressurizing the first chamber comprises removing the gas from the first chamber via an exhaust line, and introducing the gas into the first chamber comprises introducing the gas via an input line, wherein the exhaust line and the input line pass through a top of the first chamber and the second chamber.

14. The method of claim 10, wherein increasing the pressure of the first chamber comprises increasing the pressure of the first chamber to at least about 10 atmospheres, and depressurizing the first chamber comprising decreasing the pressure of the first chamber to be less than or equal to about 1 atmosphere.

15. The method of claim 11, wherein the gas is introduced into the first chamber after closing the valve assembly.

16. The method of claim 11 further comprising:
opening the valve assembly after depressurizing the first chamber.

17. A semiconductor fabrication apparatus, comprising:
a central chamber;
a high-pressure processing system coupled with the central chamber, the high-pressure processing system comprising:
a first chamber having a support to hold a substrate during processing;
a second chamber; and
a gas delivery system configured to pressurize and depressurize the first chamber, the gas delivery system comprising:
an exhaust line passing through a top of the first chamber and a top of the second chamber; and
an input line passing through the top of the first chamber and the top of the second chamber; and
a transfer robot positioned within the central chamber, the transfer robot configured to:
load the substrate on the support by passing the substrate from the central chamber and through the second chamber.

18. The semiconductor fabrication apparatus of claim 17, further comprising a controller configured to control the gas delivery system to:
depressurize the first chamber by removing a gas from the first chamber via the exhaust line; and
pressurize the first chamber by introducing the gas into the first chamber via the input line.

19. The semiconductor fabrication apparatus of claim 18, wherein the high-pressure processing system further comprises a valve assembly disposed between the first chamber and the second chamber, and wherein the controller is further configure to control the valve assembly to isolate the first chamber from the second chamber.

20. The semiconductor fabrication apparatus of claim 18, wherein the gas is one of a processing gas and steam.

* * * * *

UNITED STATES PATENT AND TRADEMARK OFFICE
CERTIFICATE OF CORRECTION

PATENT NO. : 10,529,603 B2
APPLICATION NO. : 16/292289
DATED : January 7, 2020
INVENTOR(S) : Qiwei Liang et al.

It is certified that error appears in the above-identified patent and that said Letters Patent is hereby corrected as shown below:

In the Specification

In Column 4, Line 51, delete "Ton," and insert -- Torr, --, therefor.

Signed and Sealed this
Twenty-sixth Day of May, 2020

Andrei Iancu
*Director of the United States Patent and Trademark Office*